United States Patent [19]

Stephens, Jr. et al.

[11] Patent Number: 5,548,560

[45] Date of Patent: Aug. 20, 1996

[54] SYNCHRONOUS STATIC RANDOM ACCESS MEMORY HAVING ASYNCHRONOUS TEST MODE

[75] Inventors: Michael C. Stephens, Jr.; Ajit K. Medhekar, both of San Jose; Chitranjan N. Reddy, Milpitas, all of Calif.

[73] Assignee: Alliance Semiconductor Corporation, San Jose, Calif.

[21] Appl. No.: 423,822

[22] Filed: Apr. 19, 1995

[51] Int. Cl.$^6$ .................................................. G11C 8/00
[52] U.S. Cl. ..................... 365/233.5; 365/233; 365/194
[58] Field of Search ............................. 365/233.5, 233, 365/194, 201; 326/93; 327/14

[56] References Cited

U.S. PATENT DOCUMENTS

| | | | |
|---|---|---|---|
| 5,047,984 | 9/1991 | Monden | 365/233.5 |
| 5,107,465 | 4/1992 | Fung et al. | 365/230.08 |
| 5,124,589 | 6/1992 | Shiomi et al. | 307/465 |
| 5,306,958 | 4/1994 | Reddy et al. | 307/265 |
| 5,357,480 | 10/1994 | Vinal | 365/233.5 |

Primary Examiner—David C. Nelms
Assistant Examiner—Son Dinh
Attorney, Agent, or Firm—Bradley T. Sako

[57] ABSTRACT

A burst mode static random access memory (SRAM) (10) is disclosed that includes an address transition detect signal (ATD) generating circuit (14) that provides either an asynchronous ATD signal (a-ATD) or a synchronous ATD signal (s-ATD) depending upon the logic state of a mode signal (ATM). A rising edge of the a-ATD signal is generated by a change in address. A falling edge is generated after a predetermined time period according an a-ATD circuit (60) within the ATD generating circuit (14). A falling edge of the s-ATD signal is generated by a rising edge of an internal synchronous clock pulse (CLAT). The rising edge of the s-ATD signal is generated when data are sensed on data lines (40) by an end-of-cycle circuit (20). If ATM is high, the a-ATD signal is used for timing on the SRAM (10). If ATM is low, timing is determined according to the s-ATD signal. An ATD control circuit (16) is provided to generate I/O control signals in response to the ATD signal (either s-ATD or a-ATD). On a rising edge of the ATD signal the I/O control signals place the SRAM (10) in a precharge/equalization state wherein I/O lines (24, 32, 40) are equalized and sensing circuits (28, 34) are disabled. On a falling edge of the ATD signal, the SRAM (10) is placed in a read/write mode wherein the I/O lines (24, 32, 40) are ready to sense read data or be driven by written data, and sensing circuits (28, 34) are enabled for a read operation, or alternatively disabled for a write operation.

22 Claims, 6 Drawing Sheets

SYNCHRONOUS STATIC RANDOM ACCESS MEMORY HAVING ASYNCHRONOUS TEST MODE

TECHNICAL FIELD

The present invention relates generally to semiconductor random access memories, and more particularly to synchronous static random access memories (SRAMs).

BACKGROUND OF THE INVENTION

Static random access memories (SRAMs) may be designed as asynchronous or synchronous devices. The timing of an asynchronous SRAM typically operates in response to externally provided signals. For example, it is known in the prior art for asynchronous SRAMs to generate an internal timing signal in response to a change in address. Commonly-owned U.S. Pat. No. 5,306,958, entitled HIGH-SPEED ADDRESS TRANSITION DETECTION CIRCUIT and filed on May 6, 1992, discloses an address transition detection circuit for generating a timing pulse in response to either a low-to-high or high-to-low external address input transition.

Unlike asynchronous SRAMs, most signals in synchronous SRAMs are referenced to an external system clock. Input and output signals are latched synchronous with the system clock. While asynchronous SRAMs are presently more common than synchronous SRAMs, increasingly, more computer systems are designed to employ synchronous SRAMs (typically as cache memory for a microprocessor).

A consequence of the two different types SRAMs (synchronous and asynchronous) is that integrated circuit and systems manufacturers must employ different test programs and/or machines for the two different types of SRAMs.

U.S. Pat. No. 5,124,589 issued to Shiomi et al. on Jun. 23, 1992 discloses an SRAM device capable of synchronous and asynchronous operations. Shiomi et al. illustrates both bipolar and BiCMOS embodiments of an asynchronous SRAM having additional input and output circuits. A signal (TH) of a predetermined level is used to disable a latch function of input and output circuits allowing externally supplied signals to the circuits to pass through. The input and output circuits include master and slave registers. The Shiomi et al. device has separate data inputs and outputs. During synchronous operation of the Shiomi et al. device the master register latches on the rising edge of a clock signal while the slave register is disabled. On the subsequent falling edge of the clock signal the slave register is latched and the master register is disabled.

In a bipolar embodiment of the Shiomi et al. patent, the disabling circuit requires a signal TH greater than the VEE voltage for the circuit. In a BiCMOS embodiment the disabling circuit requires a third voltage for placing an NMOS device into non-saturation. In both the bipolar and BiCMOS illustrations the third voltage is either provided separately via an additional pad or separate circuit provided to generate the voltage on the chip.

SUMMARY OF THE INVENTION

It is an object of the present invention to provide a synchronous SRAM capable of asynchronous operation that includes data ports functioning as inputs or outputs.

It is a further object of the present invention to provide a synchronous SRAM with a memory array that can be tested using conventional asynchronous SRAM test equipment.

It is a further object of the present invention to provide a synchronous SRAM with a memory array that can be tested using conventional asynchronous SRAM test programs.

It is a further object of the present invention to provide a low-power synchronous SRAM having an asynchronous mode of operation.

It is a further object of the present invention to provide a CMOS synchronous SRAM having an asynchronous test mode.

It is a further object of the present invention to provide a synchronous SRAM having an asynchronous mode for detecting slow or faulty memory cells.

According to the present invention a synchronous SRAM having an asynchronous test mode is provided. During synchronous operation a rising clock edge is used to bring a synchronous timing signal (s-ATD) to an active state. Upon a change of state of data input/output lines, indicating data has been read from or written to the memory array, an end of cycle pulse is generated which returns s-ATD to its previous state. During asynchronous operation an asynchronous timing signal (a-ATD) is generated according to a transition in address, and remains in an active state for a predetermined amount of time.

According to one aspect of the present invention, an ATD generating circuit provides either the s-ATD signal or the a-ATD signal according to an external mode signal. The ATD signal (either s-ATD or a-ATD) is provided to an ATD control circuit which provides the appropriate timing to a number of control signals for the input/output (I/O) portions of the circuit. In the preferred embodiment the timing controlled I/O portions include bit line equalization circuits, sense amplifier enable circuits, I/O line equalization circuits, and I/O sense amplifier enable circuits.

Other objects and advantages of the invention will become apparent in light of the following description thereof.

DETAILED DESCRIPTION OF THE EMBODIMENTS

Figure 1:
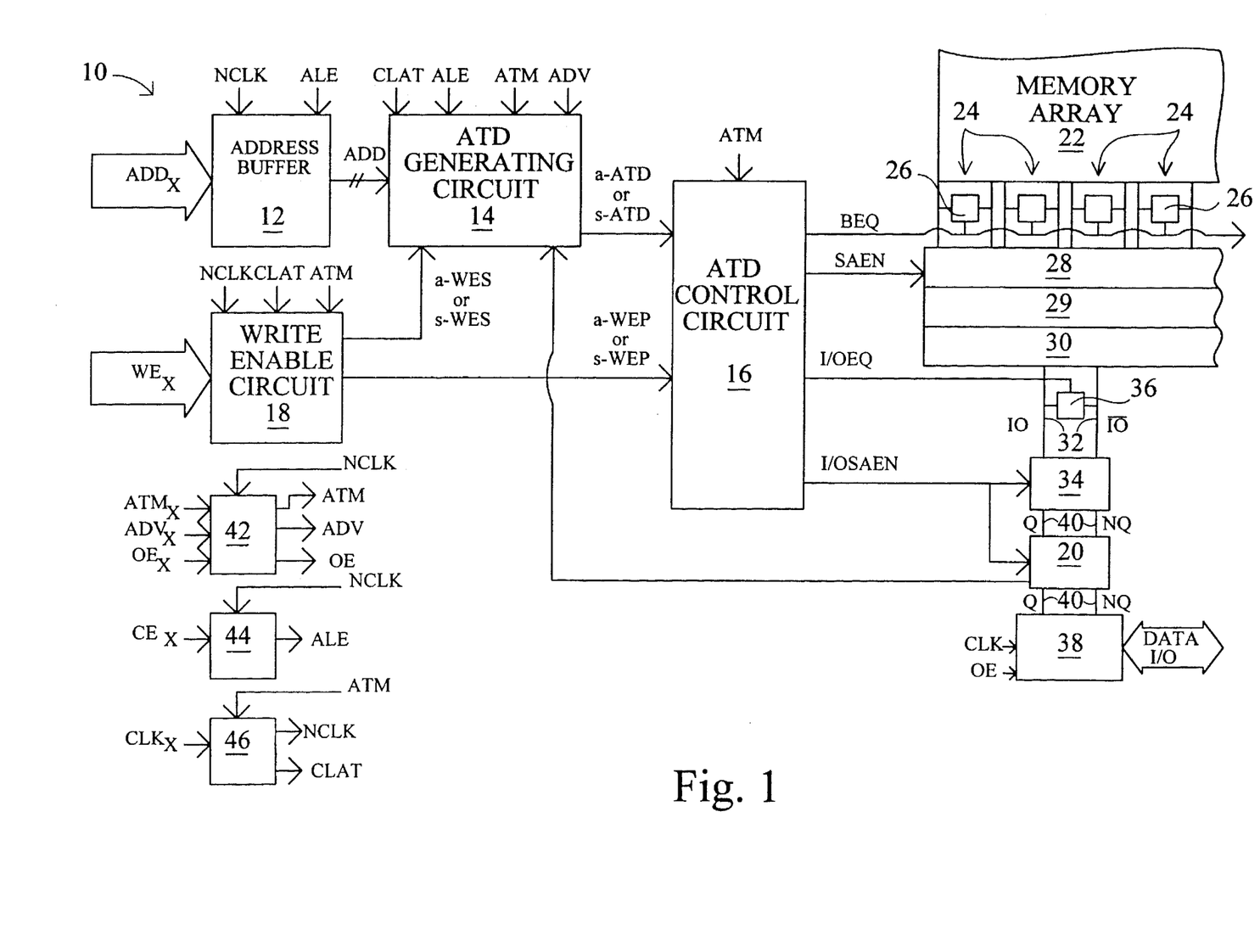
FIG. 1 is a block schematic diagram illustrating the preferred embodiment of the present invention.

FIG. 1 illustrates, generally, a block diagram of a burst mode synchronous static random access memory (SRAM) having an asynchronous test mode according to the present invention. The synchronous SRAM is designated by the general reference character 10, and is shown to include an address buffer circuit 12, an address transition detect signal (ATD) generating circuit 14, an ATD control circuit 16, a write enable circuit 18, and an end of cycle (EOC) circuit 20.

Also included is a memory array 22 having a plurality of SRAM cells arranged in a number of columns and rows, each column including a bit line pair 24. In accordance with well known principles, each bit line pair 24 has an equalization (or precharge) circuit 26 associated with it. Bit line precharge circuits 26 for SRAMs are well known in the art and so will not be discussed in detail herein. A sense amplifier array 28 is coupled to the bit lines 24 by way of a multiplexer circuit 29. The multiplexer circuit 29 provides a number of eight-into-one multiplexers to couple groups of eight bit line pairs 24 to one sense amplifier in the sense amplifier array 28.

A column decoder 30 is coupled to the array to select a column according to a column address. A pair of I/O lines 32 (shown as I/O and $\overline{I/O}$) couples the column decoder 30 to an I/O sense amp 34. While FIG. 1 illustrates a single I/O line pair 32 coupled to the column decoder, it is understood that the present invention includes a memory array 22 divided into a number of array cores with a single I/O line pair 32 being multiplexed between a number of these cores. Such decoding schemes are well known in the art and so will not be discussed in further detail herein. An I/O equalization circuit 36 is provided for equalizing the I/O lines 32. The I/O sense amp 34 is coupled to an I/O buffer 38 by two data lines 40 (shown as Q and NQ). The data lines 40 are coupled to the EOC circuit 20.

Additional input and logic circuits in the preferred embodiment include an external signal buffer circuit 42, an address latch enable (ALE) logic circuit 44, and a clock generating circuit 46. As set forth in FIG. 1, in the preferred embodiment, the external buffer circuit 42 receives an external mode signal ($ATM_x$), and external burst signal ($ADV_x$) and an external output enable signal ($OE_x$). These signals are buffered and provided to various portions of the SRAM 10 as internal control signals of the same name; a mode signal (ATM), a burst signal (ADV) and an output enable signal (OE). Thus, as shown in FIG. 1, the ATM, ADV, and OE outputs provided by the external signal buffer circuit are the same signals that are input to the ATD generating circuit 14, ATD control circuit 16, write enable circuit 18, and clock generating circuit 46. The ATM signal is provided to place the SRAM 10 in an asynchronous mode when high. The ADV signal, if active when clocked, facilitates a burst mode of operation. The OE signal, as is well known in the art, enables the output during a read operation. In the preferred embodiment OE and ATM are asynchronous, while ADV is latched according to an internal clock signal (NCLK).

The clock generating circuit 46 receives the ATM signal and an external clock signal ($CLK_x$) as inputs and provides an inverted internal clock signal (NCLK) and a delayed internal clock pulse (CLAT) as internal signals to the SRAM 10. The nature of the CLK and CLAT signals are determined according to the logic state of ATM. If ATM is high, indicating asynchronous operation, NCLK and CLAT are pulled high. If ATM is low, indicating synchronous operation, NCLK is synchronous with $CLK_x$, and CLAT is pulse of guaranteed width, generated by the rising edge of the system clock $CLK_x$. As best understood with reference to FIG. 1, the NCLK output of the clock generating circuit 46 is provided as an input to the address buffer 12, the write enable circuit 18, the I/O buffer 38, the external signal buffer circuit 42, and the ALE logic circuit 44. The CLAT output is provided as an input to the ATD generating circuit 14 and the write enable circuit 18.

The ALE logic 44 circuit receives external control signals latched by NCLK to generate an ALE signal (ALE). The ALE signal is used to enable the address buffer 12 as will be described herein. While FIG. 1 illustrates an external chip enable signal ($CE_x$) as one of the external control signals, one skilled in the art would recognize that other external signals may be used to generate ALE according to the operation of the particular SRAM 10.

Figure 2:
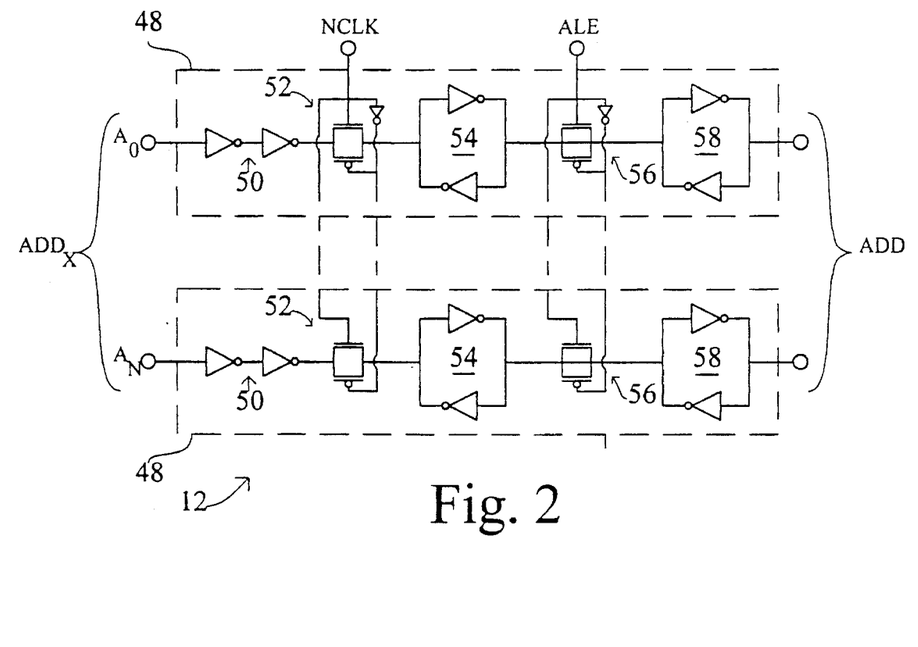
FIG. 2 is a schematic diagram illustrating the address buffer of the preferred embodiment of the present invention.

Referring once again to FIG. 1 it is shown that the address buffer circuit 12 receives an external address ($ADD_x$), the NCLK signal, and the ALE signal. In response to these signals it generates an internal address signal (ADD). Referring now to FIG. 2, a block schematic diagram is set forth illustrating the address buffer 12 of the preferred embodiment of present invention. The external address ($ADD_x$) consists of a number of address bits ($A_0$ to $A_N$), and the address buffer 12 includes a buffer signal path 48 for each bit. Each buffer path 48 includes an input buffer 50, a first address passgate 52, a first address latch 54, a second address passgate 56 and a second address latch 58. The input buffer 50 includes two inverters in series. The first passgates 52 are commonly controlled by the NCLK signal. The second passgates are commonly controlled by the ALE signal. When the SRAM 10 is in the asynchronous mode NCLK is high and passgates 52 are always on. If ALE is high in the asynchronous mode, the second passgates 56 are enabled, and the first and second latches (54 and 58) buffer the address signal. Thus, in asynchronous mode the $ADD_x$ signal propagates through the address buffer 12 and is provided as output ADD. In contrast, if the SRAM is in synchronous mode, $ADD_x$ is latched on the falling edge of NCLK, and the ADD signal is allowed to change on the rising edge of the ALE signal. Accordingly, the output of the address buffer 12 is a clocked signal during synchronous operation. As shown in FIG. 1, ADD is provided as an input to the ATD generating circuit 14.

One skilled in the art will recognize that the address signal (ADD) is also provided to row and column decoders (not shown). Such circuits are well understood in the art and will not be discussed in any further detail herein.

Figure 3:
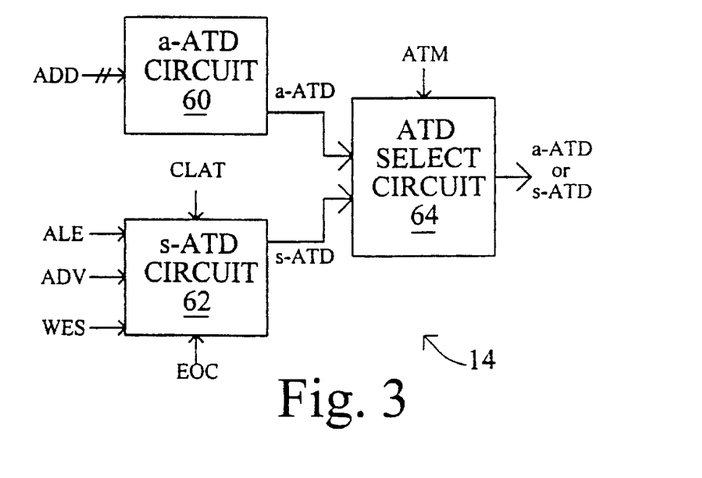
FIG. 3 is a block diagram illustrating the ATD generating circuit of the preferred embodiment of the present invention.

FIG. 3 sets forth a block diagram of the ATD generating circuit 14 which is shown to include an asynchronous ATD circuit 60, a synchronous ATD circuit 62, and an ATD select circuit 64. According to well known principles, the asynchronous ATD circuit 60 receives the address signal ADD and generates an asynchronous ATD signal (a-ATD) whenever a change in address occurs. In accordance with well understood design principles, a-ATD is a signal of predetermined, limited duration. ATD signal generating circuits for asynchronous SRAMs are known in the art and so will not be discussed in detail herein. It is understood that an a-ATD signal could also be generated from additional external signals. As just one example, a chip enable signal or a combination of chip enable signals could be used to generate a-ATD.

The synchronous ATD circuit 62 generates a synchronous ATD signal (s-ATD). It is understood that while the synchronous timing signal is called "s-ATD" herein, it is not generated by a change in address. The first edge of s-ATD (in the preferred embodiment a falling edge) is generated from a delay clock pulse CLAT edge and logic determined from the ALE, ADV and WES inputs. The second (rising) edge of s-ATD is created by a pull-up circuit activated by an end-of-cycle signal (EOC). The generation of both EOC and WES will be discussed at a later point herein. As shown in the figure, s-ATD and a-ATD are provided to the ATD select circuit 64. The ATD select circuit 64, receives the ATM signal, and if it is high (indicating asynchronous operation) it will output the a-ATD signal. If ATM is low, the ATD select circuit 64 provides the s-ATD signal as an output.

Figure 4:
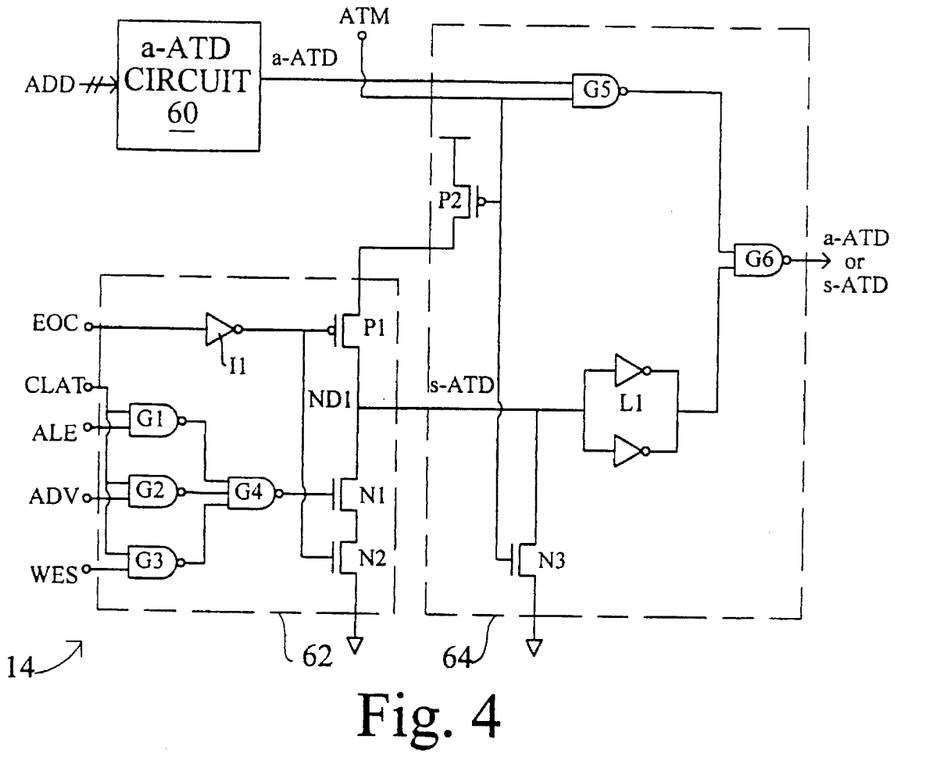
FIG. 4 is a schematic diagram illustrating the s-ATD generating circuit and the ATD select circuit of the preferred embodiment of the present invention.

Referring now to FIG. 4, preferred embodiments of the synchronous ATD circuit 62 and ATD select circuit 64 are illustrated. The synchronous ATD circuit 62 includes four NAND gates (G1–G4), inverter I1, p-channel MOS transistor P1 and n-channel MOS transistors N1 and N2. P1 has its source coupled to the ATD select circuit 64 and its drain coupled to the drain of N1. N1 has its source coupled to the drain of N2 and the source of N2 is coupled to ground. EOC is inverted by I1 and applied to the gates of P1 and N2. The outputs of G1–G3 are provided as inputs to G4, and the output of G4 drives the gate of N1. G1–G3 each have two inputs, one of which is CLAT. The other inputs to G1–G3 are ALE, ADV and WES, respectively.

The generation of s-ATD begins with EOC low. With EOC low, P1 is turned off and N2 is turned on. Provided any of the signals ALE, ADV or WES are high, on the rising edge of CLAT, N1 will turn on, pulling the drains of N1 and P1 (node ND1) low by way of N2. This generates the falling edge of s-ATD. Provided the source of P1 is coupled to a high logic state, when EOC falls, N2 is turned off and P1 is turned on, pulling ND1 high. This is the subsequent rising edge of the s-ATD signal.

Referring once again to FIG. 4, it is shown that the ATD select circuit 64 includes two NAND gates (G5 and G6), a latch L1 and disable transistors P2 and N3. G5 is a two input gate that receives the ATD signal as a first input and the ATM signal at a second input. G6 is a two input gate that receives the output of G5 and the output of L1 as inputs. As set forth in the figure, L1 receives s-ATD as an input. P2 has its drain coupled to the source of P1, and its source coupled to the positive supply voltage. N3 has its drain coupled to the input of L1 and its source coupled to ground. The gates of P2 and N3 are coupled to ATM. When ATM is high (asynchronous mode) P2 is turned off, disabling the pull-up abilities of the s-ATD circuit and N3 is turned on, pulling the input of L1 low. In this manner s-ATD is disabled. With the ATM input to G5 and the output of L1 both high, the output of G6 follows a-ATD. When ATM is low (synchronous mode) the output of G5 will always be high, disabling the a-ATD signal. The ATM signal also turns off N3 and P2 is turned on, enabling P1. With P1 on and N3 off, the s-ATD signal generated by the s-ATD circuit 62 propagates through L1 and is provided at the output of G6.

Figure 5:
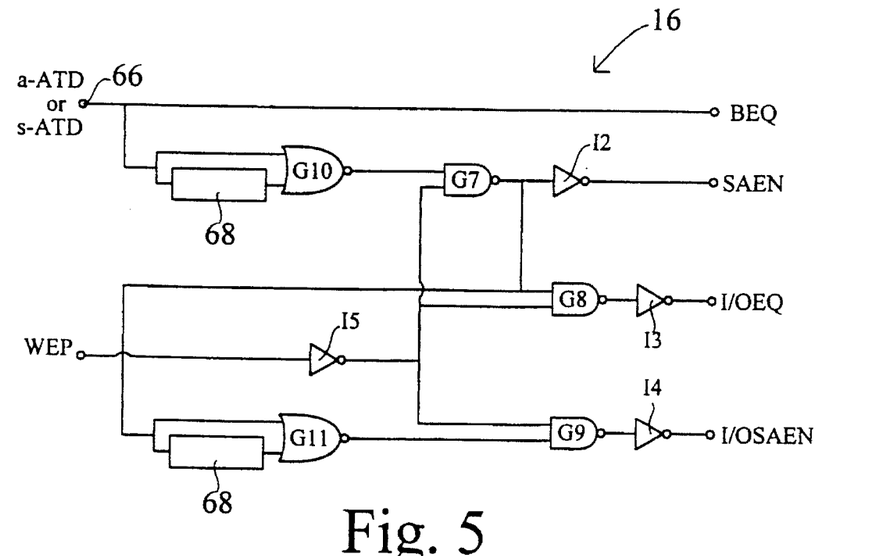
FIG. 5 is a block schematic diagram illustrating the ATD control circuit of the preferred embodiment of the present invention.

Referring now to FIG. 5, a block schematic diagram is set forth illustrating the ATD control circuit 16 of the preferred embodiment. The control circuit input 66 receives an ATD signal (either a-ATD or the s-ATD) from the ATD generating circuit 14. As shown in the figure, in response to the ATD signal and the write enable pulse (WEP), the ATD control circuit 16 provides a number of I/O control signals. In the preferred embodiment the I/O control signals are a bit line equalization signal (BEQ), a sense amplifier enable signal (SAEN), an I/O line equalization signal (I/OEQ), and an I/O sense amplifier enable signal (I/OSAEN). BEQ is generated directly from the ATD signal. A falling ATD signal results in a falling BEQ signal, and a rising ATD signal results in a rising BEQ signal.

The I/O control signals SAEN, I/OEQ and I/OSAEN are generated in a similar fashion to BEQ, but are further controlled by the WEP signal. The generation of WEP will be discussed at a later point herein. Referring once again to FIG. 5, it is shown that the ATD control circuit 16 also includes three, two input NAND gates G7, G8 and G9. The outputs of the NAND gates generate the SAEN, I/OEQ and I/OSAEN signals respectively, by way of inverters I2, I3 and I4. WEP is provided as an input to each NAND gate by way of an inverter I5. In the event WEP is high, a low input is received at each of the NAND gates (G7–G9) and the NAND gate outputs are driven high, regardless of the other inputs. The high NAND gate outputs are inverted by inverters I2–I4, and SAEN, I/OEQ and I/OSAEN are driven low. In this manner, a write operation (indicated by WEP being high) places SAEN, I/OEQ and I/OSAEN in a low (disable) mode.

In the case where WEP is low, SAEN, I/OEQ and I/OSAEN change state according to the ATD signal (s-ATD or a-ATD). SAEN is generated by way of two input NOR gate G10, NAND gate G7 and inverter I2. ATD is applied to both inputs of G10, one of which includes a delay circuit 68. As a result, a falling edge of BEQ will generate a delayed, rising edge of SAEN. Conversely, a rising BEQ edge generates a falling SAEN edge, without additional delay. To generate I/OEQ, SAEN (inverted) is provided as one input to G8. As described previously, the output of G8 is applied to inverter I3 to generate I/OEQ. Accordingly, I/OEQ is the inverse of SAEN. To generate I/OSAEN, SAEN (inverted) is also provided as an input to G9 by way of the two input NOR gate G11 having a delay circuit 68 at one input. In a similar fashion to G10, a falling SAEN (inverted) signal will generate a delayed rising output at G11. This output results in a delayed rising I/OSAEN with respect to a rising SAEN. A falling SAEN will result in a falling G11 output, without additional delay. It is understood that the delay circuits 68 set forth in FIG. 5 do not necessarily have the same delay values.

Referring once again to FIG. 1, the arrangement of the various I/O control signals is illustrated. The BEQ signal is commonly coupled to the bit line equalization circuits 26. As BEQ goes high, the bit lines are equalized. SAEN drives the sense amplifier array 28, to couple a sense amplifier to a selected bit line pair 24. As SAEN goes high, the sense amplifiers will be enabled and will sense the differential voltage on the selected bit lines. The I/OEQ signal is coupled to the I/O equalization circuit 36, and when high, the I/O lines 32 are equalized. Like the sense amplifier array 28, the I/O sense amplifier 34 is alternately enabled or disabled according to a high or low I/OSAEN signal. The I/OSAEN signal is also applied to the end-of-cycle circuit 20. As will be recalled from the previous discussion, when WEP is high, SAEN, I/OEQ and I/OSAEN are all driven low. Thus, during a write operation (WEP high) the sense amplifiers, I/O equalization circuit, and I/O sense amplifier are all disabled.

Figure 6:
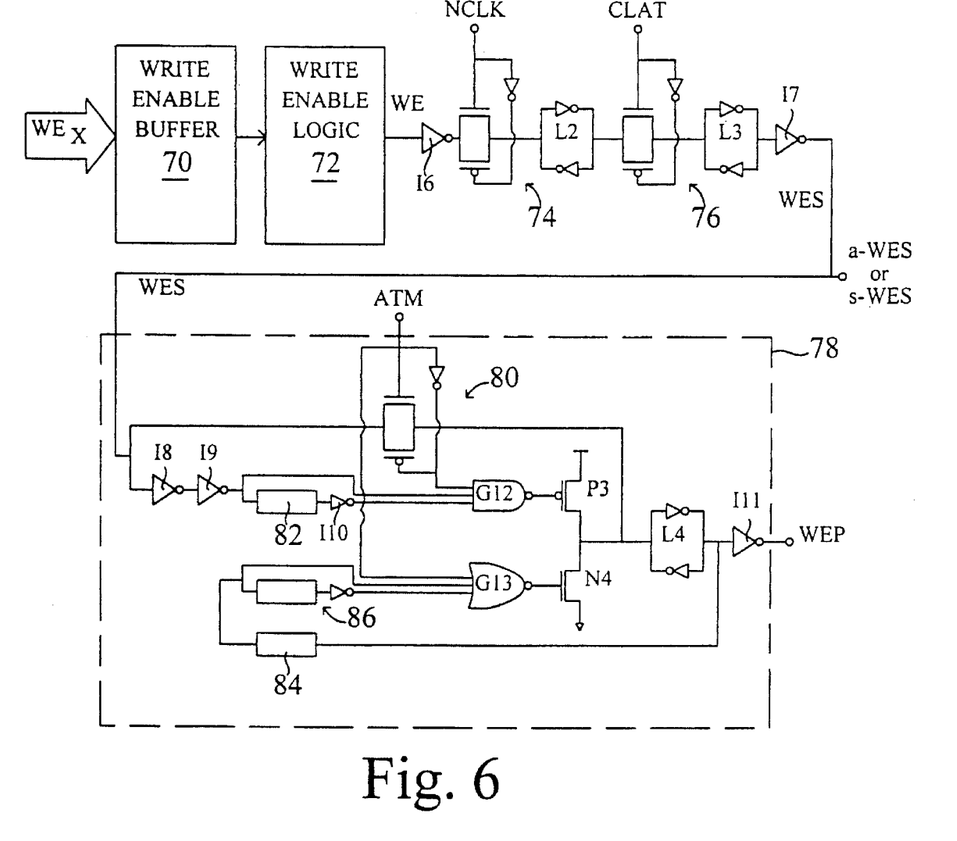
FIG. 6 is a block schematic diagram illustrating the write enable circuit of the preferred embodiment of the present invention.

Referring once again to FIG. 1, it is shown that the write enable circuit 18 receives an external write enable signal $WE_x$ and in response to the NCLK, CLAT and ATM signals, generates either a synchronous write enable signal (s-WES) and write enable pulse (s-WEP), or an asynchronous write enable signal (a-WES) and write enable pulse (a-WEP). The write enable circuit 18 of the preferred embodiment is shown in FIG. 6. The external write enable signal $WE_x$ is received by a write enable buffer 70. It is understood that WE$_x$ is a number of external signals controlling when a memory write may be executed. The write enable logic section 72, receives the buffered control signals and generates a WE signal if a write operation is to take place. The WE signal passes through inverter 16 and is clocked by NCLK at a first WE passgate 74 into a latch L2. The output of L2 is clocked by CLAT at a second WE passgate 76 into latch L3. The output of L3 is applied to inverter I7 to generate the WES signal. Similar to the address buffer 12, in the synchronous mode, the resulting WES signal (s-WES) is a clocked signal because NCLK and CLAT are synchronous with the external clock. In asynchronous mode, the resulting WES signal (a-WES) follows directly from WE, as both NCLK and CLAT are pulled high.

Referring again to FIG. 6 it is shown that the write enable circuit 18 also includes a write enable control circuit 78 which provides either an a-WEP signal or an s-WEP signal depending upon to the logic state of ATM. The WES signal (either s-WES or a-WES) is applied to both a write enable passgate 80 and inverter I8.

If ATM is low (synchronous operation), passgate 80 is off and s-WES (a clocked signal) is not able to pass through. The signal s-WES is applied through inverters I9 and I10 to NAND gate G12 by way of a direct input, and a delayed, inverted input. The delayed, inverted input is created by a first WE delay circuit 82 and inverter I10. With ATM low, NAND gate G12 is enabled. Accordingly, on a rising WES edge, a delayed, low pulse is generated by G12. The low pulse turns on pull-up transistor P3 and the input of latch L4 is pulled high. The output of L4 passes through a second WE delay circuit 84 to NOR gate G13, by way of a direct input and a delayed, inverted input 86. With ATM low, the input to G13 generates a delayed, high pulse. The delayed high pulse turns on pull-down transistor N4, and the input to L4 is pulled down. The output of L4 is applied to inverter I11 to generate WEP. In this manner, in synchronous mode, s-WEP is a pulse that is generated by a rising edge of s-WES.

If ATM is high, the ATM signal is applied to G13 and inverted ATM is applied to G12. This forces the output of G12 high and the output of G13 low, regardless of the logic of the other inputs to the gates. In this manner P3 and N4 are turned off, disabling the pulse generating circuit which generates s-WEP. At the same time, passgate 80 is enabled and a-WES is applied through L4 and I11 to generate a-WEP. Accordingly, in the asynchronous mode of operation, the a-WEP output follows the a-WES signal.

Figure 7:
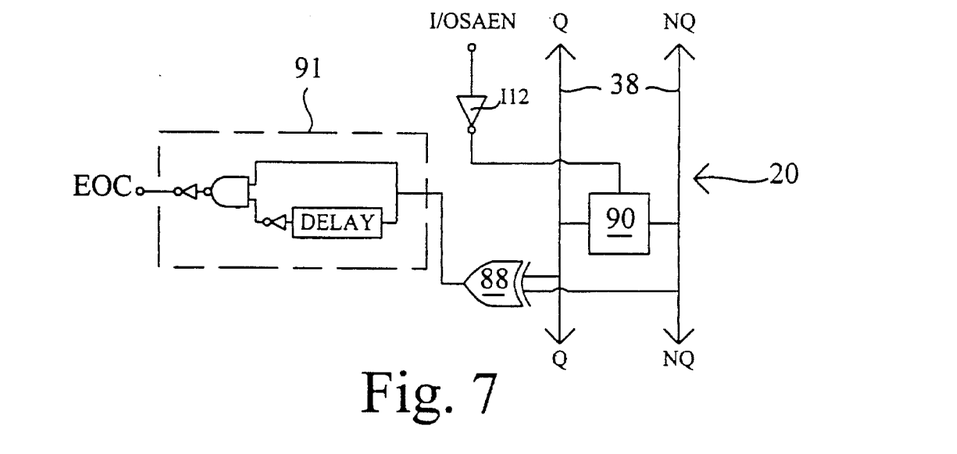
FIG. 7 is a schematic diagram illustrating the end-of-cycle circuit of the preferred embodiment of the present invention.

As mentioned previously, in synchronous operation the EOC signal is generated by the end-of-cycle circuit 20. The end-of-cycle circuit 20 of the preferred embodiment is set forth in FIG. 7, and includes a two input XOR gate 88, a precharge low circuit 90, an inverter I12, and a pulse generating circuit 91. The two inputs of XOR gate 88 are data lines 38 Q and NQ. The output of the XOR gate 88 is provided as an input to the pulse generating circuit 91. The precharge low circuit 90 is connected to the data lines 38 and is activated by the I/OSAEN signal by way of inverter I12. Thus, provided I/OSAEN is in a high state, any change of state across Q and NQ will cause the output of XOR gate 88 to go high. In response to the high output, the pulse generator 91 outputs a high going pulse, which is the EOC signal. The output of XOR gate 88 goes low when the falling edge of the I/OSAEN signal disables the I/O sense amplifier (not shown in FIG. 7) and precharges Q and NQ to a low state.

Figure 8:
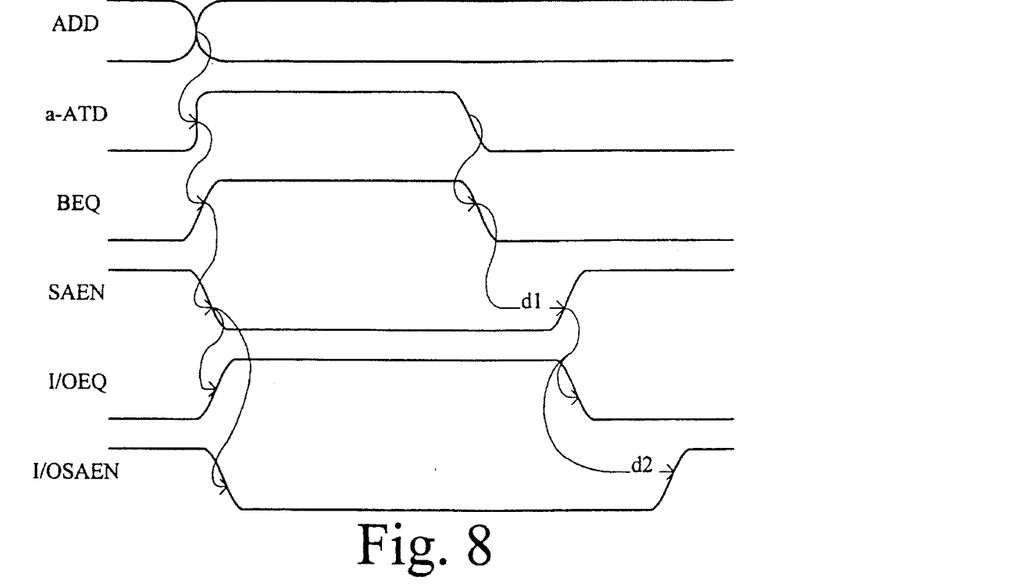
FIG. 8 is a timing diagram illustrating the asynchronous mode of operation of the preferred embodiment of the present invention.

Referring now to FIG. 8, a timing diagram illustrating the typical asynchronous test mode of the preferred embodiment is set forth. The timing diagram is best understood in conjunction with FIGS. 1 and 5. As mentioned previously, to place the SRAM 10 in the asynchronous test mode ATM is brought high. The ATD generating circuit 14 detects a change in address and generates a rising edge of the a-ATD signal. The a-ATD signal has a preset duration determined by the a-ATD generating circuit 60. The a-ATD signal is applied to the ATD control circuit 16 where it drives signal BEQ high, equalizing bit lines 24. SAEN is driven low by the rising edge of BEQ, disabling the sense amplifiers 28. I/OEQ is driven high by the falling edge of SAEN and equalizes the I/O lines 32. I/OSAEN is driven low by the falling edge of SAEN and disables the I/O sense amplifier 34. This series of timing signals places the SRAM 10 in a precharge/equalization state which precharges all the data I/O lines in preparation for either a read or a write operation.

After the predetermined duration of the a-ATD signal, a-ATD returns low. The falling edge of a-ATD drives BEQ low. Following a delay (d1) BEQ forces SAEN high, enabling the sense amplifier array 28. The rising edge of SAEN drives I/OEQ low which disables the I/O equalization circuit 36. A high going SAEN drives I/OSAEN high following a delay (d2), enabling the I/O sense amplifier 34. This series of timing signals places the SRAM 10 in an access state in which the memory array 22 may be written to or read from. During a read operation, the sensing circuits (sense amplifiers 28 and I/O sense amplifiers 34) are enabled, while the equalization circuits are disabled. Such a read operation is reflected by the timing signals of FIG. 8. As will be recalled, during a write operation WEP is high forcing SAEN, I/OEQ and I/OSAEN low. As a result, the sense amplifiers 28, the I/O equalization circuit 36, and the I/O sense amplifier 34 are all disabled.

Figure 9:
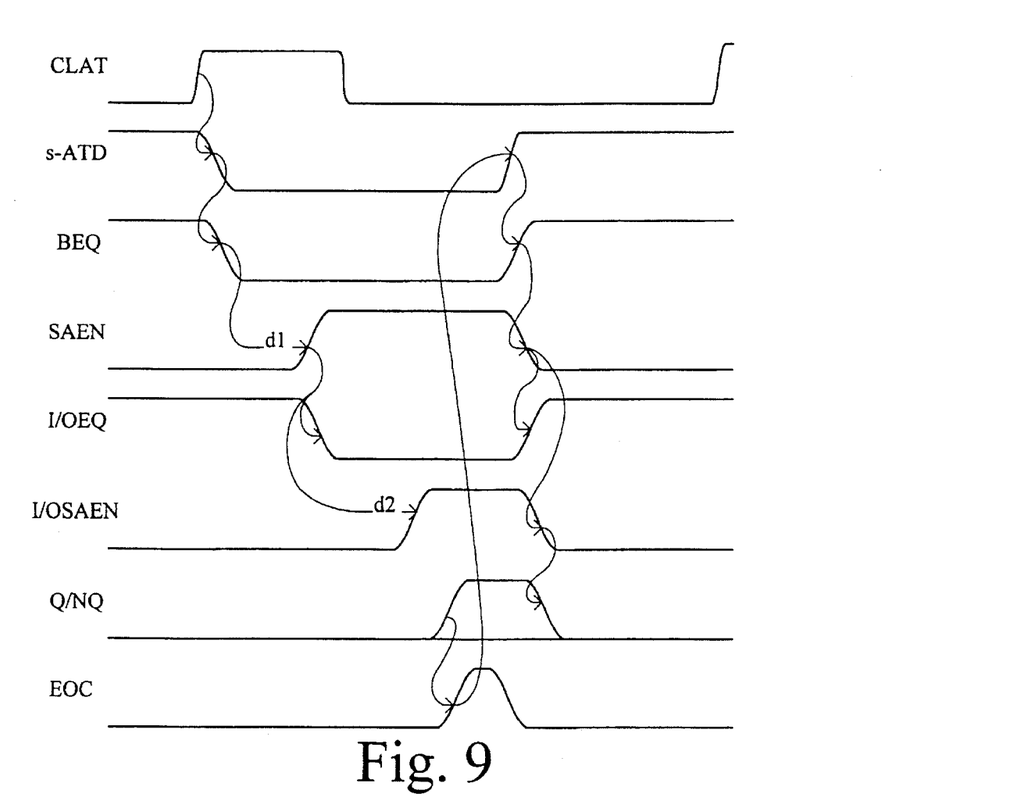
FIG. 9 is a timing diagram illustrating the synchronous mode of operation of the preferred embodiment of the present invention.

FIG. 9 is a timing diagram illustrating the synchronous mode of operation. Unlike the asynchronous mode of operation, which generates a rising a-ATD signal upon a change in address, in the synchronous mode the s-ATD signal is driven low on the rising clock edge of CLAT. The generation of signals BEQ, SAEN, I/OEQ, and I/OSAEN occurs in the same manner as in the falling edge of the a-ATD signal in the asynchronous mode of operation described above. In contrast to the a-ATD signal, the s-ATD signal is not of a predetermined duration. Following the falling edge of a-ATD, Q and NQ are in a precharged low state. When either signal (Q or NQ) goes high (indicating read or written data on the data lines), the EOC pulse is generated which drives s-ATD high. The timing of BEQ, SAEN, I/OEQ and I/OSAEN following the rising edge of s-ATD is the same as that of the rising edge of the a-ATD. In addition, as shown in FIG. 9, the falling edge of I/OSAEN precharges data lines Q and NQ low.

Figure 10:
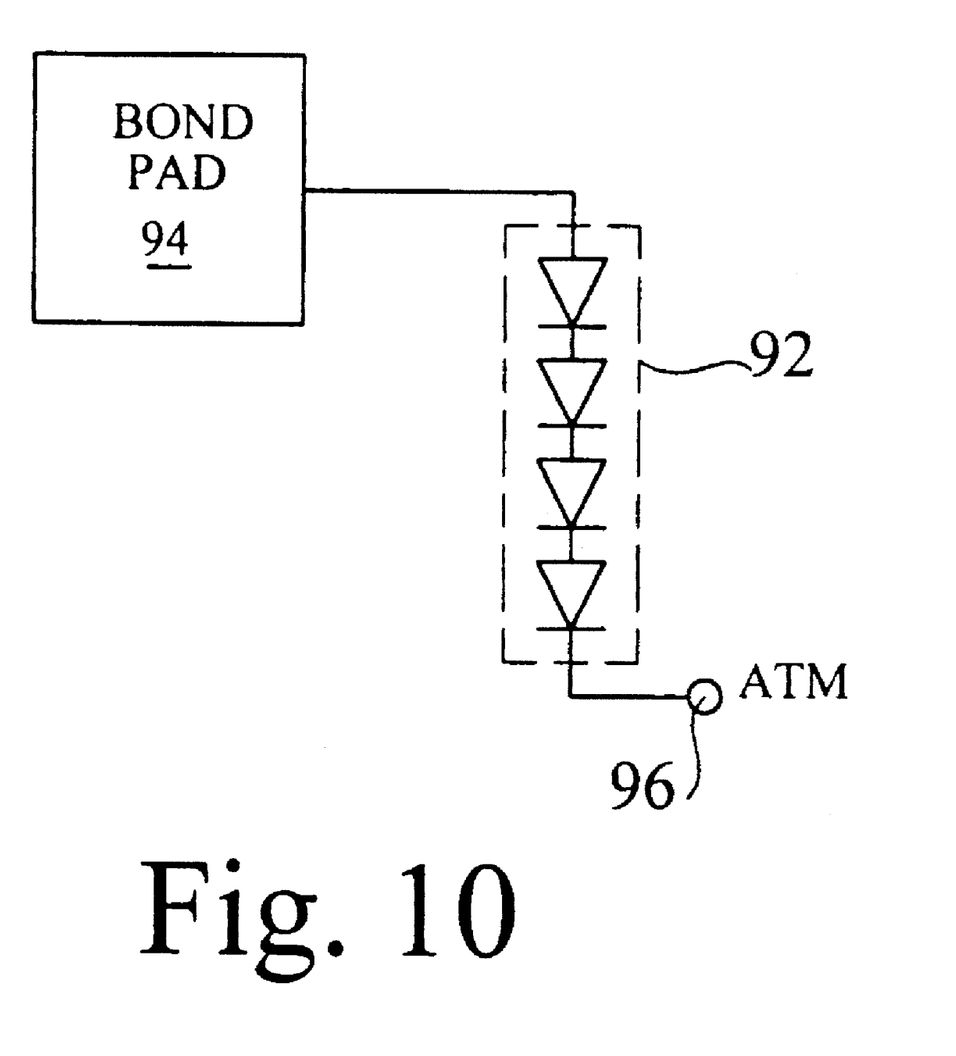
FIG. 10 is a schematic diagram illustrating a circuit for generating an ATM signal.

In the preferred embodiment the SRAM 10 is fabricated as an integrated circuit die that is equipped with an ATM test bond pad for receiving the ATM signal. The extra bond pad is intended to be contacted by a probe when the SRAM 10 is in wafer or die form. In an alternate embodiment of the present invention, an enable circuit is coupled to the bond pad to require a voltage at the bond pad that is greater than a logic high voltage in order to generate the ATM signal. Such an arrangement is set forth in FIG. 10. As shown in the figure the enable circuit 92 includes a number of diodes are situated between the bond pad 94 and an ATM output 96. This guarantees that in the event the bond pad is connected to a package lead frame via a bond wire, the asynchronous test mode cannot be accidentally triggered by a logic high signal being applied to the corresponding package pin. One skilled the art would recognize that alternate enable circuits 96 can be arrived at.

One skilled in the art would also recognize that the invention has been described in connection with its preferred embodiments, and may be changed, and other embodiments derived, without departing from the spirit and scope of the invention. Accordingly, the invention is intended to be limited only by the appended claims.

What we claim is:

1. A semiconductor static random access memory device, comprising:

at least one memory array, said array including a plurality of memory cells arranged in rows and columns;

a clock generating circuit for generating an internal clock signal in response to an external clock and an external mode signal, the internal clock signal being a synchronous clock corresponding to the external clock when said external mode signal is in a first logic state, the internal clock signal being an asynchronous control signal when said external mode signal is in a second logic state, the asynchronous control signal being at one logic state;

an asynchronous ATD signal generating circuit for receiving memory address signals and generating an asynchronous ATD signal (a-ATD) in response to a change in the memory address signals;

a synchronous ATD generating circuit responsive to the synchronous clock signal for generating a synchronous ATD signal (s-ATD); and an ATD selection circuit for providing an ATD control signal (c-ATD) in response to the external mode signal, c-ATD being the s-ATD signal in response to the external mode signal of the first logic state, c-ATD being a-ATD in response to an external mode signal of the second logic state.

2. The memory device of claim 1 wherein:

said ATD selection circuit includes means responsive to the external mode signal for alternately disabling the s-ATD signal and enabling the a-ATD signal or enabling the s-ATD signal and disabling the a-ATD signal according to the logic state of the external mode signal.

3. The memory device of claim 2 wherein:

the first logic state of the external mode signal is a low state and the second logic state of the external mode signal is a high state; and said ATD selection circuit includes a first NAND gate for receiving the a-ATD signal and the external mode signal as inputs, a second NAND gate for receiving the output of the first NAND gate and an s-ATD as inputs, the s-ATD input being held high in response to an external mode signal of the second logic state, the s-ATD input being the s-ATD signal in response to an external mode signal of the first logic state.

4. The memory device of claim 1 wherein:

said synchronous ATD generating circuit includes a plurality of first NAND gates, the outputs of each said first NAND gate being inputs to a second NAND gate, each said first NAND gate having a synchronous clock input for receiving the synchronous clock and a control input for receiving a control signal.

5. The memory device of claim 1 further including:

an input/output (I/O) buffer;

data lines intermediate said I/O buffer and said memory array;

an end-of-cycle signal generator for generating an end of cycle signal (EOC) in response to a change in the logic state of said data lines, said EOC signal being coupled to the synchronous ATD generating circuit; and said synchronous ATD generating circuit generates a first s-ATD signal edge in response to a clock edge of the synchronous clock and a second s-ATD signal edge in response to the EOC signal.

6. The memory device of claim 5 wherein:

the data lines include a data line and an inverted data line, the data line and inverted data line being precharged low prior to reading data from or writing data to said memory array; and said end of cycle signal generator is an XOR gate having the data line and inverted data line as inputs thereto.

7. The memory device of claim 5 wherein:

said synchronous ATD generating circuit includes first and second transistors of a first conductivity type, and a third transistor of the second conductivity type, the first transistor having its source connected to a first logic level, its drain connected to the source of the second transistor, the second transistor having its drain connected to the drain of the third transistor and its gate receiving a clocked control signal that is clocked from the internal clock signal, the third transistor having its source connected to a mode disabled second logic level, the first and third transistors being alternately activated or disabled according to the logic state of the EOC signal, and the s-ATD signal being generated at the node formed by the drain-drain connection of the second and third transistors.

8. The memory device of claim 1 further including:

an address buffer for receiving an external memory address and providing an internal memory address, said address buffer buffering the memory address signals when the internal clock signal is the asynchronous control signal, and latching the memory address signals on a clock edge when said internal clock signal is the synchronous clock; and said asynchronous ATD generating circuit receives the internal memory address and generates the a-ATD signal therefrom.

9. The memory device of claim 8 wherein:

the external address includes a plurality of external address signals, and for each external address signal said address buffer includes a buffer circuit for receiving the external address signal, a first latch, a first passgate intermediate said first latch and said buffer circuit, a second latch, and a second passgate intermediate the first latch and the second latch, the first passgate being operated by the internal clock signal, the second passgate being operated by an address latch enable control signal.

10. The memory device of claim 1 further including:

an ATD control circuit for generating a plurality of I/O control signals in response to the c-ATD signal from said ATD selection circuit.

11. The memory device of claim 10 wherein:

said memory array includes a plurality of bit line pairs, each bit line pair being equalized by at least one bit line equalization circuit; and said ATD control circuit is coupled to the bit line equalization circuit, and the I/O control signals include a bit line equalization signal for activating the bit line equalization circuit, the bit line equalization signal being generated by an edge of the c-ATD signal.

12. The memory device of claim 11 further including:

at least one sense amplifier enabling circuit for enabling an array of sense amplifiers coupled to the columns of said memory array; and said ATD control circuit is coupled to said sense amplifier enabling circuit, and the I/O control signals include a sense amplifier enable signal for activating the sense amplifier enabling circuit, the sense amplifier enable signal being generated from the bit line equalization signal.

13. The memory device of claim 10 further including:

a column decoder for providing at least one decoder I/O output in response to a column address;

at least one decoder I/O equalization circuit coupled to the decoder I/O output; and said ATD control circuit is coupled to said decoder I/O equalization circuit, and the I/O control signals include a decoder I/O enable signal for activating the decoder I/O equalization circuit, the decode enable signal being generated from the sense amplifier enable signal.

14. The memory device of claim 10 further including:

a write control circuit responsive to at least one external write enable signal for generating a write control output, the write control output being an asynchronous write signal (a-WEP) in response to a mode signal of the second logic state, and a synchronous write pulse (s-WEP) in response to a mode signal of the first logic state, the a-WEP signal following the logic state of the external write signal, the s-WEP pulse being generated by clocking the external write signal with the synchronous clock, said write control circuit providing the write control output to said ATD control circuit; and said ATD control circuit includes I/O signal disable means for disabling selected ones of the I/O control signals in response to the write control output.

15. The memory device of claim 14 wherein:

said write control circuit includes a synchronous circuit portion for generating the s-WEP, an asynchronous circuit portion for generating the a-WEP, and a selection disable circuit for disabling the synchronous circuit in response to an external mode signal of the second logic state and disabling the asynchronous circuit in response to an external mode signal of the first logic state.

16. The memory device of claim 15 wherein:

the synchronous circuit portion includes a clocking portion, the clocking portion clocking the external write enable signal to generate a clocked write enable signal.

17. The memory device of claim 16 wherein:

the synchronous circuit portion further includes a pulse pull-up circuit, a pulse pull-down circuit, a latch, and a signal delay circuit, the pulse pull-up circuit providing a logic high pulse input to the latch in response to an edge of the clocked write enable signal, the pulse pull-down circuit providing a logic low pulse input to the latch in response to a delay feedback signal, the delay feedback signal being the latch output delayed by the signal delay circuit.

18. The memory device of claim 14 wherein:

said write control circuit includes a write enable buffer for buffering the external write enable signal, a first write enable latch, a first write enable passgate intermediate the first write enable latch and the write enable buffer, a second write enable latch, and a second write enable passgate intermediate the second write enable latch and the first write enable latch, the first write enable latch being clocked by the internal clock signal, the second write enable latch being clocked by a delayed internal clock signal.

19. The memory device of claim 10 wherein:

said plurality of I/O signals include a precharge/equalization mode, and an access mode, a rising c-ATD edge placing said plurality of I/O signals into the precharge/equalization mode, a falling c-ATD signal placing said plurality of I/O signals into the access mode.

20. The memory device of claim 19 wherein:

said memory array includes at least one pair of data sensing lines and precharging means for precharging the data sensing lines; and the precharge/equalization mode includes a precharge signal for the enabling the precharging means.

21. The memory device of claim 19 wherein:

said memory array includes at least one sense amplifier for sensing data from said memory array; and the access mode includes an enable signal for enabling the sense amplifier.

22. The memory device of claim 1 further including:

the second state of the external mode signal being a logic high state;

a mode input pad for receiving a mode enabling signal;

an enable circuit coupled to said mode input pad, said enable circuit generating the external mode signal in response to a mode enabling signal of a higher voltage than the external mode signal.

* * * * *